(12) United States Patent
Greco et al.

(10) Patent No.: US 7,439,173 B2
(45) Date of Patent: Oct. 21, 2008

(54) INCREASING ELECTROMIGRATION LIFETIME AND CURRENT DENSITY IN IC USING VERTICALLY UPWARDLY EXTENDING DUMMY VIA

(75) Inventors: Stephen E. Greco, Lagrangeville, NY (US); Chao-Kun Hu, Somers, NY (US); Paul S. McLaughlin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/869,044

(22) Filed: Oct. 9, 2007

(65) Prior Publication Data

US 2008/0026567 A1 Jan. 31, 2008

Related U.S. Application Data

(62) Division of application No. 11/163,410, filed on Oct. 18, 2005, now Pat. No. 7,301,236.

(51) Int. Cl.
*H01L 21/4763* (2006.01)
(52) U.S. Cl. .................... 438/620; 438/622; 438/624; 257/758; 257/E21.576
(58) Field of Classification Search ......... 438/618–624, 438/637–639, 672–673; 257/785
See application file for complete search history.

(56) References Cited

U.S. PATENT DOCUMENTS 5,675,187 A    10/1997    Numata et al.
6,103,617 A    8/2000     Yoon et al.
6,181,012 B1   1/2001     Edelstein et al.
6,197,685 B1   3/2001     Domae et al.
6,307,268 B1 * 10/2001    Lin ............................ 257/774
6,342,733 B1   1/2002     Hu et al.
6,399,897 B1   6/2002     Umematsu et al.
6,489,684 B1   12/2002    Chen et al.
6,717,268 B2   4/2004     Hau-Riege
2003/0089996 A1   5/2003  Hau-Riege
2004/0067638 A1   4/2004  Hau-Riege
2004/0251555 A1   12/2004 Asai et al.
2005/0121792 A1 * 6/2005  Harada ....................... 257/758
2005/0266677 A1 * 12/2005 Hayashi et al. ............. 438/627

FOREIGN PATENT DOCUMENTS

JP   3034545 A       2/1991
JP   07074176        3/1995
JP   2000012688 A    1/2000

* cited by examiner

*Primary Examiner*—Dung A. Le
(74) *Attorney, Agent, or Firm*—Lisa Jaklitsch; Hoffman Warnick

(57) ABSTRACT

An integrated circuit with increased electromigration lifetime and allowable current density and methods of forming same are disclosed. In one embodiment, an integrated circuit includes a conductive line connected to at least one functional via, and at least one dummy via having a first, lower end electrically connected to the conductive line and a second upper end electrically unconnected (isolated) to any conductive line. Each dummy via extends vertically upwardly from the conductive line and removes a portion of a fast diffusion path, i.e., metal to dielectric cap interface, which is replaced with a metal to metallic liner interface. As a result, each dummy via reduces metal diffusion rates and thus increases electromigration lifetimes and allows increased current density.

13 Claims, 3 Drawing Sheets

INCREASING ELECTROMIGRATION LIFETIME AND CURRENT DENSITY IN IC USING VERTICALLY UPWARDLY EXTENDING DUMMY VIA

This application is a divisional of U.S. patent application Ser. No. 11/163,410, filed on Oct. 18, 2005 now U.S. Pat. No. 7,301,236, currently allowed.

BACKGROUND OF THE INVENTION

1. Technical Field

The invention relates generally to integrated circuits, and more particularly, to an integrated circuit and method of forming same with increased electromigration lifetime and allowable current density using at least one vertically upwardly extending dummy via.

2. Background Art

Electromigration is a common cause of malfunction in interconnects of integrated circuits (ICs). Electromigration includes physical motion of atoms out of areas where current density is very high, which is caused primarily by frictional force between metal ions and flowing electrons. The eventual result is a break in a metal line, especially those made of aluminum (Al). This is the main reason why aluminum (Al) interconnects are being replaced with copper (Cu) interconnects in advanced IC technology. However, electromigration also occurs in copper (Cu) wiring due to copper diffusion during current flow. Much of the diffusion occurs at the interface between the top of the copper wiring and the dielectric cap, which is typically a thin layer of silicon nitride ($Si_3N_4$) or silicon carbide (SiC). Accordingly, one current challenge for advanced IC technologies is increasing electromigration lifetimes for back-end-of-line (BEOL) copper wiring or, in other words, increasing the allowable current densities in copper wiring.

There are a number of approaches to increase allowable current density for a given set of groundrules. In one approach, the cross-sectional wire area is increased by increasing wire height. This approach, however, results in an increase in capacitive coupling, and reduces the process window for damascene metal fill. Based on the knowledge that shorter run-lengths can have longer electromigration lifetimes, in another approach, long metal wire run-lengths are broken into shorter run-lengths by dropping them down to a lower wiring level or sending them up to an upper wiring level through a via to a short link at the lower or upper level. Then, the metal wiring is brought back to the original metal level through another via. The approach described, however, adds to the resistance of the wiring because the vias add significant resistance, and makes the circuit more prone to failure because of the various via failure modes. This approach is also expected to reduce circuit density because it requires wires to move up or down to other levels and then back, which expends density above and below.

Another approach to increase allowable current density is to use a selective metal cap deposition process to cap the metal lines before depositing the dielectric cap. This approach is disclosed in U.S. Pat. No. 6,342,733 B1 to Hu et al., which uses a metal cap such as cobalt-tungsten-phosphorous (CoWP). The approach described, however, adds cost and complexity. In addition, this approach raises concerns with shorting reliability failure due to spurious deposition between metal lines.

In a similar approach, the copper wiring is capped with refractory metal such as tantalum (Ta), tantalum nitride (TaN), etc., by using a "reverse liner" process. This process includes performing a slight etchback of the copper after chemical mechanical polishing (CMP), a blanket deposition of the refractory metal and CMP to remove the refractory metal in the field areas. While this approach enhances electromigration lifetimes, it also adds cost and complexity, and presents concerns with the process window across a wide range of pattern factors.

In another approach, metallic reservoirs in the form of passive or dummy vias are used on interconnects as a source or sink for electromigration material, slowing the build up of electromigration-induced mechanical stress. This approach is disclosed in U.S. Pat. No. 6,171,268 and related publications 2003/0067638 and 2003/0089996, all to Hau-Riege. This approach, however, does not slow metal diffusion, it merely provides a source of additional metal such that metal atoms diffusing out can be replaced, thus delaying the onset of a void in the metal. Similar approaches, which suffer from the same drawbacks, are disclosed in U.S. Pat. No. 6,489,684 to Chen et al. and JP 2000 012688A to Masaaki.

In view of the foregoing, there is a need in the art for a solution to increasing electromigration lifetimes of IC interconnects and increasing allowable current density that does not suffer from the problems of the related art.

SUMMARY OF THE INVENTION

An integrated circuit with increased electromigration lifetime and allowable current density and methods of forming same are disclosed. In one embodiment, an integrated circuit includes a conductive line connected to at least one functional via, and at least one dummy via having a first, lower end electrically connected to the conductive line and a second upper end electrically unconnected (isolated) to any conductive line. Each dummy via extends vertically upwardly from the conductive line and removes a portion of a fast diffusion path, i.e., metal to dielectric cap interface, which is replaced with a metal to metallic liner interface. As a result, each dummy via reduces metal diffusion rates and thus increases electromigration lifetimes and allows increased current density.

A first aspect of the invention provides an integrated circuit comprising: a conductive line connected to at least one functional via; and at least one dummy via having a first, lower end electrically connected to the conductive line and a second upper end electrically unconnected to any conductive line.

A second aspect of the invention provides a method of increasing electromigration performance in an integrated circuit, the method comprising the steps of: forming a conductive line; and forming at least one dummy via having a first, lower end electrically connected to the metal line and a second upper end electrically unconnected to any conductive line.

A third aspect of the invention provides an integrated circuit comprising: a conductive line connected to at least one functional via, the at least one functional via being electrically connected to at least one other conductive line; and at least one dummy via electrically connected to the conductive line and extending vertically upwardly from the conductive line, wherein each dummy via is electrically isolated from any other conductive line.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

As indicated above, the invention provides an integrated circuit with increased electromigration lifetime and allowable current density and methods of forming same. In one embodiment, an integrated circuit includes a conductive line connected to at least one functional via, and at least one dummy via having a first, lower end electrically connected to the conductive line and a second upper end electrically unconnected (isolated) to any conductive line. Each dummy via extends vertically upwardly from the conductive line and removes a portion of a fast diffusion path, i.e., metal to dielectric cap interface, which is replaced with a metal to liner interface. As a result, each dummy via reduces metal diffusion rates and thus increases electromigration lifetimes and allows increased current density.

Figure 1:
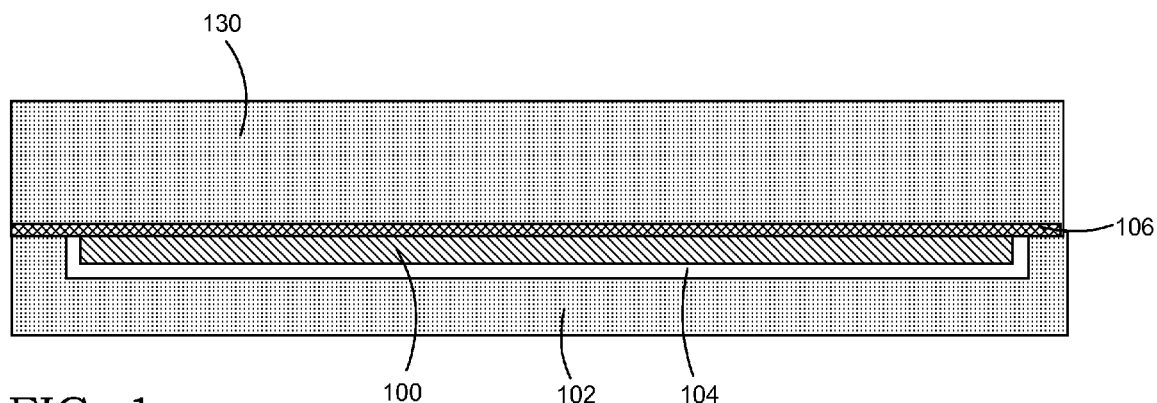
FIGS. 1-4 show one embodiment of a method of increasing electromigration performance in an integrated circuit according to the invention.

Turning to the drawings, FIGS. 1-4 show one embodiment of a method according to the invention. FIG. 1 shows a first step of forming a conductive line 100. Conductive line 100 may include any metal commonly used for integrated circuit (IC) interconnects, e.g., copper (Cu), aluminum (Al), etc. Conductive line 100 is embedded in a dielectric 102 such as silicon dioxide ($SiO_2$), hydrogenated silicon oxycarbide (SICOH), porous SiCOH, etc. Conductive line 100 may be surrounded by a liner material 104 such as tantalum (Ta), tantalum nitride (TaN), etc., which typically has a thickness of approximately 30 Å to approximately 200 Å for a first metallization layer in a 65 nm generation chip using copper (Cu). A long axis of conductive line 100 is parallel to the page. Conductive line 100 may be formed by any conventional damascene processing techniques. A height (metal and liner) of conductive line 100 for a first metallization layer is on the order of approximately 1000 Å to approximately 1800 Å, and a width (into page) is on the order of approximately 800 Å to approximately 1200 Å. Conductive line 100 is capped with a thin dielectric diffusion barrier layer 106, such as silicon nitride ($Si_3N_4$) or silicon carbide (SiC), typically approximately several hundred angstroms in thickness. Conductive line 100 could represent a first metallization layer or, beneath dielectric 102, other metallization layers, dielectric layers and transistors (not shown) could be provided. For the purposes of description, conductive line 100 will be considered as part of a first metallization layer.

Figure 2:
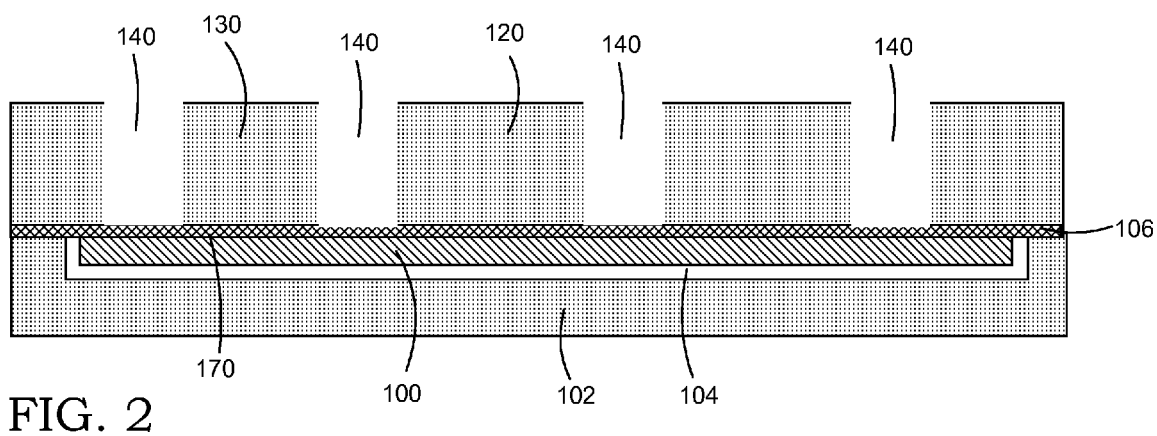

A next step includes forming at least one dummy via 120 (FIG. 4) having a first, lower end 122 (FIG. 4) electrically connected to conductive line 100 and a second upper end 124 (FIG. 4) electrically unconnected to any conductive line. FIG. 1 shows a first part of this step including forming another dielectric layer 130. Dielectric layer 130 may include dielectric material such as silicon dioxide ($SiO_2$), hydrogenated silicon oxycarbide (SICOH), porous SiCOH, etc. FIG. 2 shows a second part of this step including forming via openings 140 in dielectric layer 130. This step may include any conventional lithography and reactive ion etching (RIE) techniques. Openings 140 will become vias 120, among other things. Openings 140 may have a minimum diameter of, for example, approximately 800 Å to approximately 1200 Å for a layer 130 on top of a first metallization level, or they could be somewhat larger than minimum diameter. While four openings 140 are shown for simplicity, it should be understood that there could, in real cases, be many more, or less. In a conventional "via first" dual damascene process, some or all of diffusion barrier layer 106 is typically left at the bottom of openings 140 after via RIE.

Figure 3:
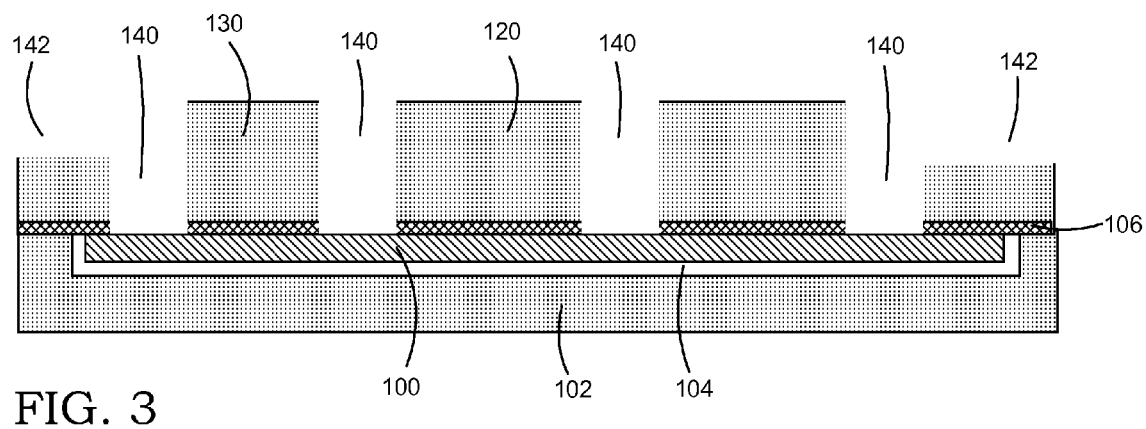

FIG. 3 shows a next part including conventional lithography and reactive ion etching (RIE) to define a plurality of trenches 142 in dielectric layer 130 for conductive lines to be formed therein. This step also removes diffusion barrier layer 106 from the bottoms of openings 140.

Figure 4:
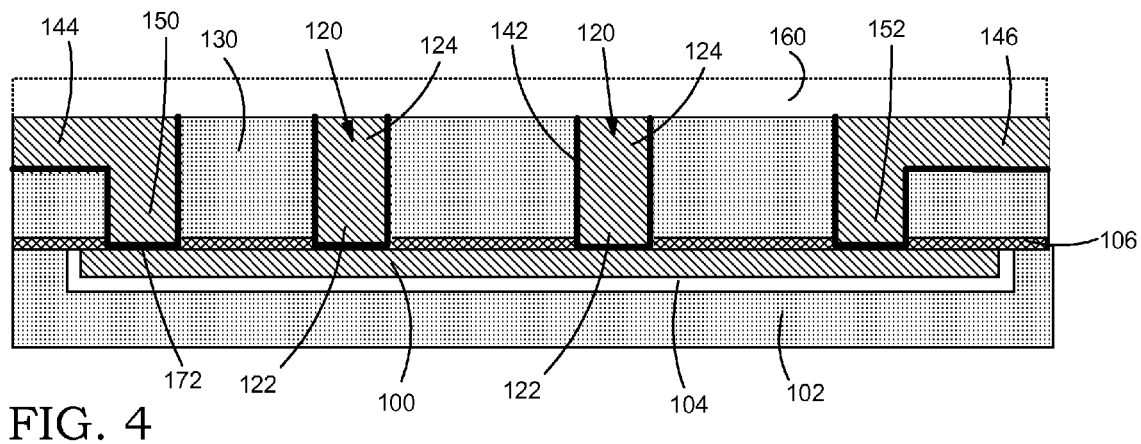

A next part, as shown in FIG. 4, includes conventional liner 146 formation, seed deposition, metal (e.g., copper) electroplating, and chemical mechanical polishing (CMP) steps to fill trenches 142 and openings 140. This step forms a next layer 160, e.g., another metallization level. Conductive lines 144, 146 are in electrical contact with functional vias 150, 152, respectively. Functional vias 150, 152 are referred to as such because they electrically contact conductive line 100 and conductive lines 144, 146. As such, these functional conductive lines 144, 146 and functional vias 150, 152 form part of the functional circuitry, which is essential to the operability of the semiconductor devices. However, this step also forms dummy vias 120, which intentionally (by mask design) do not have conductive line segments above them when next layer 160 (shown in phantom) is formed. Dummy vias 120 are called dummy vias because they are in electrical contact with the underlying conductive line 100, but are not part of any active circuitry in the sense that they are not required to conduct current up to next layer 160 to make semiconductor devices operable. That is, each dummy via 120 is electrically isolated from any conductive line except conductive line 100. Each dummy via 120 extends vertically upwardly from conductive line 100. Formation of dummy vias 120 is preferably provided on the same via reticle as functional vias 150, 152, and therefore would be formed in the normal manner without any extra processing steps. However, it should be recognized that dummy vias 120 may be formed using separate processing known to those skilled in the art rather than that described above, if desired.

As shown in FIG. 4, dummy vias 120 are in electrical contact with conductive line 100 and as such, their fabrication has removed portions of the metal (e.g., copper) to diffusion barrier layer 106 interface (170 in FIG. 2), and replaced it with a metal to metallic liner interface 172. That is, each dummy via 120 extends through diffusion barrier layer 106 that extends over conductive line 100. Therefore, dummy vias 120 interrupt copper to diffusion barrier layer interface 170, which allows for relatively fast copper diffusion. Dummy vias 120 introduce metal to metallic liner interface 172, which has much slower metal (copper) diffusion properties, thus extending electromigration lifetime and allowing for increased current density. The metallic liner may include any now known or later developed material such as tantalum nitride (TaN), tantalum (Ta) or combinations thereof.

A number of dummy via 120 on top of a particular conductive line 100 segment could be as small as one, or there could be a plurality of dummy vias 120. It is expected that the amount of electromigration lifetime enhancement may be some function of the density of dummy vias 120, over some range of dummy via spacing. However, it is possible that even one dummy via 120 placed properly may have some of the desired effect. For example, electromigration failure is normally the result of void growth at the cathode end of a conductive line 100. Accordingly, one dummy via placed at a distance of perhaps a few microns to twenty microns from the cathode end of conductive line 100 may cause some electromigration lifetime enhancement. Dummy vias 120 should not have a significant effect on the resistance of conductive line 100, and therefore should not alter circuit characteristics significantly. The greatest electromigration lifetime enhancements may occur in cases where conductive line 100 has a bamboo type structure (not shown), which allows for minimal diffusion for copper along copper grain boundaries.

Figure 5:
FIGS. 5-8 show various embodiments of a cross-sectional shape in a horizontal direction of each dummy via.
Figure 6:
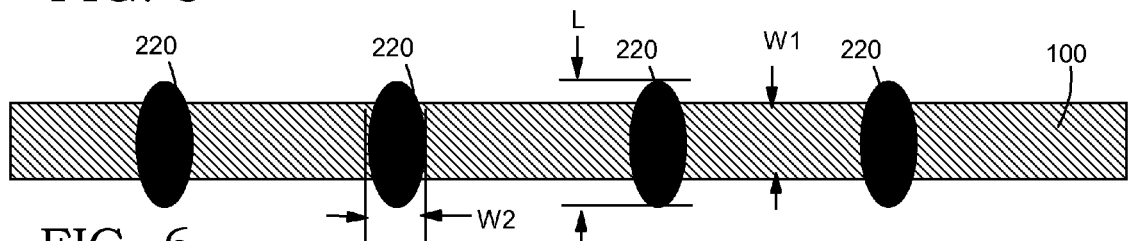
Figure 7:
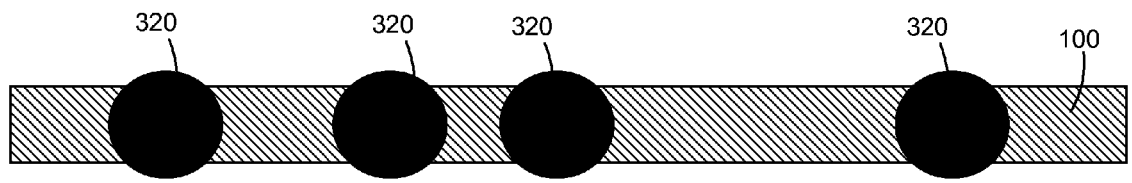
Figure 8:
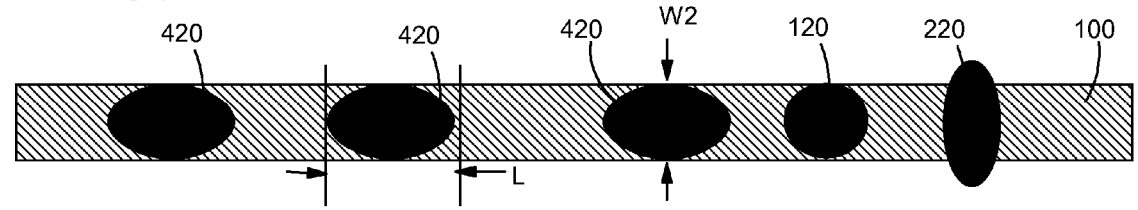

Turning to FIGS. 5-8, various alternative embodiments of, for example, a cross-sectional shape in a horizontal direction of each dummy via will now be described. In one embodiment, as shown in FIG. 5, at least one dummy via 120 is formed such that it is fully landed on conductive line 100. In this case, a dummy via 120, if sized the same as functional vias, is typically near a width (W1) of underlying conductive line 100. It should be recognized, however, that some groundrules may not allow the bottom of dummy via 120, if it is sized the same as functional vias, to intersect underlying conductive line 100 across its entire width when taking critical dimension (CD) and overlay tolerances into consideration (the vias normally are not "fully landed"). In contrast, as shown in FIG. 6, according to one alternative embodiment, at least one dummy via 220 may be placed on conductive line 100 such that the dummy via 220 extends beyond a width (W1) of conductive line 100. As shown in FIGS. 5 and 7, at least one dummy via 120, 320, respectively, may have a substantially circular cross-section in a horizontal direction. Alternatively, as shown in FIGS. 6 and 8, at least one dummy via 320 and 420, respectively, may have an elongated cross-section in a horizontal direction, e.g., oval. In this case, the elongated cross-section may have a length (L) to width (W2) ratio of approximately 2:1 in the horizontal direction. FIG. 6 shows an elongated cross-section for a dummy via 220 that extends beyond a width (W1) of conductive line 100, i.e., the length (L) of it extends across conductive line 100, and FIG. 8 shows an elongated cross-section for a dummy via 420 that is fully landed on conductive line 100, i.e., the length (L) of it extends along conductive line 100. It should be recognized that the FIG. 8 embodiment may have limitations in length (L) based on whether it changes the resistance of conductive line 100 by creating a significant parallel conduction path. FIG. 7 shows a substantially circular cross-section for a dummy via 320 that extends beyond a width (W1) of conductive line 100. A diameter of the enlarged substantially circular cross-section in FIG. 7 may be, for example, twice that of a conventional via. The FIGS. 6 and 7 embodiments may offer an advantage in slowing diffusion because they can remove the metal to liner interface 170 (FIG. 2) across the entire width (W1) of conductive line 100. It should be recognized that other dummy via shapes may also be used. As shown in FIG. 8, different cross-sectional shapes may be used together, if desired.

FIGS. 5-8 also illustrate that, in one embodiment, dummy vias are preferably spaced evenly along conductive line 100, although they may be spaced unevenly also. In one embodiment, each dummy via is spaced from an adjacent dummy via on an order of no less than approximately 1 μm and no greater than approximately 100 μm. In any event, each dummy via is preferably placed a distance from any conductive line of a layer 160 above to substantially prevent capacitive coupling. This provision potentially be completed in the design phase by a designer first deciding that a particular conductive line 100 must allow the higher current density provided according to the invention. The designer would then place dummy vias 120 on top of the particular conductive line 100 at regular intervals. In this case, dummy vias 120 would be on a different design level than functional vias 150, 152 (FIG. 4) used to make interconnects. As circuitry is added at next layer 160, a computer aided design tool would be able to slide dummy vias 120 along conductive line 100, within certain limits, in order to accommodate the upper level wiring.

It should be recognized that the thicknesses and dimensions for lines, vias, liners, caps, etc. described above are typical for local wiring in 65 nm generation devices. The invention, however, could also be used to enhance electromigration lifetimes in global wiring, which is typically greater in height and width than local wiring.

As shown in FIG. 4, the above-described method forms an integrated circuit 200 including a conductive line 100 connected to at least one functional via 150, 152, and at least one dummy via 120, et al., having a first, lower end 122 electrically connected to conductive line 100 and a second upper end 124 electrically unconnected to any conductive line.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of increasing electromigration performance in an integrated circuit, the method comprising:
    forming a first conductive line connected to a lower end of at least one functional via; and
    forming at least one dummy via having a first, lower end electrically connected to the first conductive line and a second upper end electrically unconnected to any other conductive line,
    wherein the at least one dummy via interrupts a metal to a diffusion barrier layer interface of the first conductive line to introduce a metal to a metallic liner interface,
    wherein the at least one dummy via and the at least one functional via extend upwardly from substantially the same plane, and
    wherein the at least one dummy via includes a horizontal cross-section of substantially the same size as the at least one functional via.

2. The method of claim 1, wherein the at least one dummy via forming includes forming the at least one dummy via fully landed on the first conductive line.

3. The method of claim 1, wherein the at least one dummy via forming includes forming the at least one dummy via placed on the first conductive line such that the at least one dummy via extends beyond a width of the first conductive line.

4. The method of claim 1, wherein the at least one dummy via has a substantially circular cross-section in a horizontal direction.

5. The method of claim 1, wherein the at least one dummy via has an elongated cross-section in a horizontal direction.

6. The method of claim 5, wherein the elongated cross-section has a length to width ratio of approximately 2:1 in the horizontal direction.

7. The method of claim 5, wherein the length extends across the first conductive line.

8. The method of claim 5, wherein the length extends along the first conductive line.

9. The method of claim 1, wherein the at least one dummy via forming includes forming a plurality of dummy vias.

10. The method of claim 9, wherein each of the plurality of dummy vias is spaced from an adjacent dummy via on an order of no less than approximately 1 µm and no greater than approximately 100 µm.

11. The method of claim 9, wherein the plurality of dummy vias are spaced evenly along the first conductive line.

12. The method of claim 1, wherein the at least one dummy via forming includes placing each dummy via a distance from any conductive line of a layer above to substantially prevent capacitive coupling.

13. The method of claim 1, further comprising forming vias electrically connected to another functional conductive line.

* * * * *